United States Patent [19]

Platakis et al.

[11] 4,080,926

[45] Mar. 28, 1978

[54] APPARATUS FOR GROWING FILMS BY FLASH VAPORIZATION

[75] Inventors: Nicolaos S. Platakis, San Jose, Calif.; Harry C. Gatos, Weston, Mass.

[73] Assignee: Massachusetts Institute of Technology, Cambridge, Mass.

[21] Appl. No.: 744,000

[22] Filed: Nov. 22, 1976

Related U.S. Application Data

[62] Division of Ser. No. 573,240, Mar. 30, 1975.

[51] Int. Cl.² .............................................. C23C 13/12
[52] U.S. Cl. ......................................... 118/5; 118/7; 118/49.1; 219/10.41
[58] Field of Search .................................. 118/48–49.1; 427/50, 51, 69, 70, 78, 91, 99, 107, 109, 124, 166, 167, 237, 248–252; 148/174, 175, 189; 219/275, 10.41; 156/610, 608, 611, 615

[56] References Cited

U.S. PATENT DOCUMENTS

| | | | |
|---|---|---|---|
| 3,183,563 | 5/1965 | Smith, Jr. ......................... | 118/49.1 X |
| 3,400,241 | 9/1968 | Gloersen et al. ................. | 118/49.1 X |
| 3,494,853 | 2/1970 | Anderson et al. ................. | 118/7 X |
| 3,506,803 | 4/1970 | Hart .................................... | 118/49 X |
| 3,607,135 | 9/1971 | Gereth et al. ..................... | 118/49 X |
| 3,704,216 | 11/1972 | Kinstley et al. .................. | 250/542 X |
| 3,930,463 | 1/1976 | Bickerdike et al. ............... | 118/49.1 |

FOREIGN PATENT DOCUMENTS

| | | | |
|---|---|---|---|
| 754,102 | 8/1956 | United Kingdom ................. | 427/251 |

OTHER PUBLICATIONS

IBM Technical Disclosure Bulletin, "Manufacturing Reproducible Uniform Composition Alloy Layers Containing at Least Two Components", Ruh et al., vol. 12, No. 11, [Apr. 1970], pp 2016, 2017.

Primary Examiner—Morris Kaplan
Attorney, Agent, or Firm—Arthur A. Smith, Jr.; Robert Shaw

[57] ABSTRACT

A method of and apparatus for growing films composed of low-melting-point materials from a feed material whose constituents have large differences in vapor pressure. In the system disclosed, the feed material is contained within an ampoule whose only outlet is a downwardly directed capillary tube and delivered in the form of a melt to a heated environment whose temperature is higher than the temperature of vaporization of the constituent of the feed material having the highest vaporization temperature, thereby to effect flash vaporization of the liquid and thus avoid changes in composition or phase separation.

6 Claims, 1 Drawing Figure

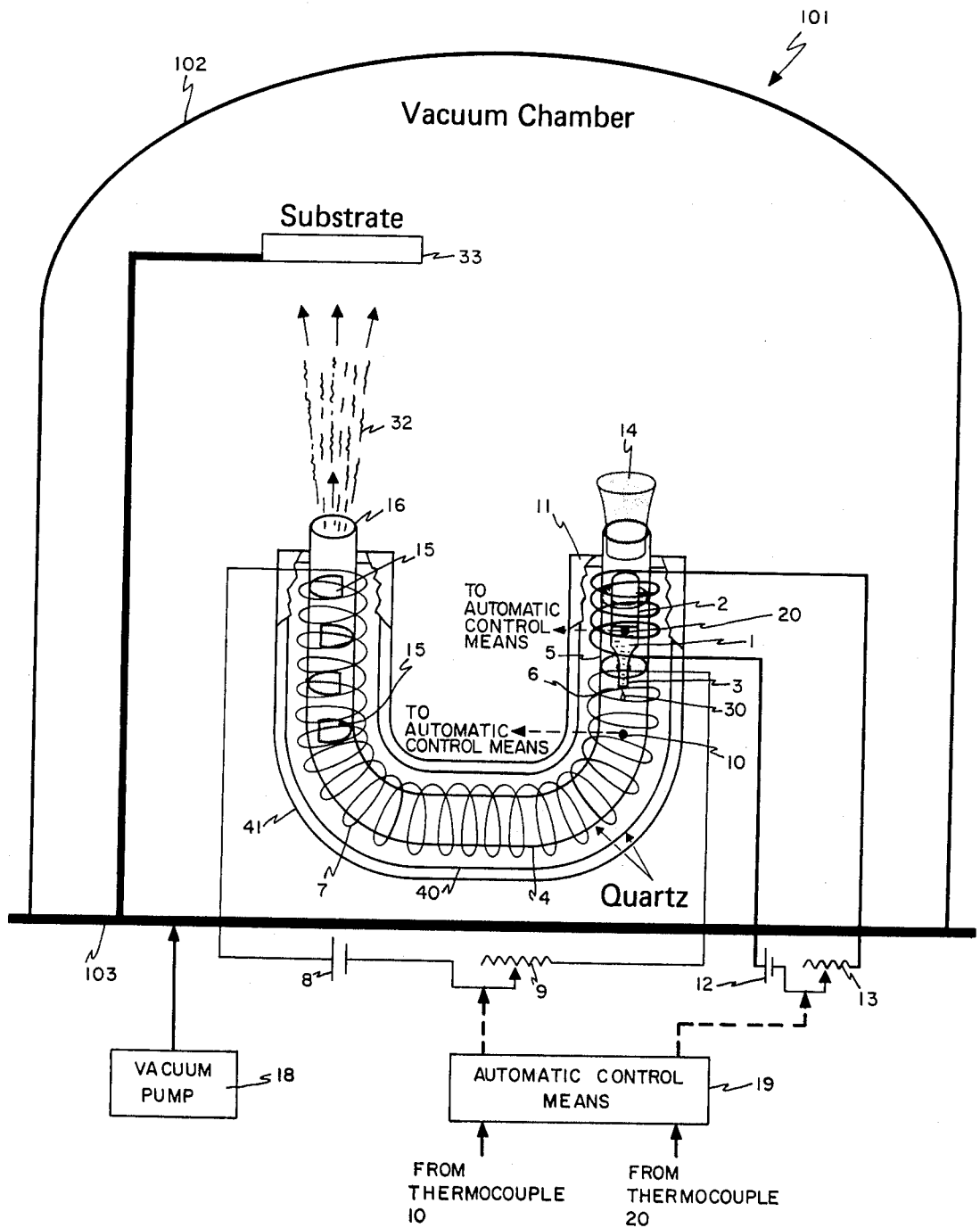

APPARATUS FOR GROWING FILMS BY FLASH VAPORIZATION

The invention described herein was made in the course of or under a grant from the National Science Foundation, an agency of the United States Government.

This is a division of Ser. No. 573,240 filed Mar. 30, 1975, filed to comply with a requirement for restriction in the earlier application.

The present invention relates to the preparation of crystalline films and amorphous films having the identical composition of the feed material by evaporation.

The extensive use of films in microelectronics, optical instruments and the like, and the stringent requirement on the properties of such films impose a requirement for precise control of the quality thereof. The most important aspects, in this respect, are the structure and the chemical composition of the film since they both determine its electrical and optical porperties. The growth of such films is commonly done by sputtering, electron beam melting in an open boat and flash evaporation. Each growth method has its advantages and disadvantages and the choice of method lies heavily in the particular material to be evaporated. Flash evaporation, as hereinafter discussed, is particularly suited for feed materials whose constituents have large differences in their vapor pressure. The principle of this method is that of total flash evaporation of small amounts of a material at a constant rate without change in the composition of the residual material in the course of such evaporation. Flash evaporation without composition change of the melt prevents phase separation caused by a large difference in the volatility of the constituents of the vaporized feed material. Deposition due to drop spatter is also minimized or prevented. Constant rate vaporization secures constant rate deposition which, in most cases, is a necessary condition for obtaining uniform structure and therefore good quality films. In prior art systems, such flash vaporization is achieved by preheating a furnace to a temperature several hundred degrees above the melting point of the material to be volatilized; the feed material is then introduced in powdered form slowly by way of a vibrating channel which then delivers the powder to the high-temperature region at a pre-determined slow rate. Unfortunately, variations in the feeding rate as well as the presence of the molten phase do occur with resulting diminution in the quality of the film. Furthermore, melting of the feed material at the tip of the channel or plugging of a funnel through which the feed material is introduced to the furnace are common problems.

Accordingly, an object of the present invention is to provide a novel flash evaporation system for deposition of crystalline and non-crystalline films.

A further object is to provide a system wherein phase separation is eliminated.

A still further object is to provide a system wherein the vaporization rate is regulated and can be kept constant, thereby leading to structurally homogeneous films.

These and still further objects are discussed hereinafter and are particularly pointed out in the appended claims.

The invention is hereinafter discussed with reference to the accompanying drawing the single FIGURE of which is an elevation view, mostly schematic in form, of apparatus adapted to perform in accordance with the present teachings.

Before discussing the invention with reference to the accompanying drawing, a short preliminary explanation is made. It is noted above that the flash evaporation system for film deposition is employed to deposit from a feed material whose constituents (also called "components" and "constituent materials" herein) have large differences in vapor pressure. It is necessary, in order to provide a satisfactory film, to deposit the constituents in the film growth process in the same ratio as they appear in the feed material. One of the severe problems that has arisen in the past is that, in the course of vaporization of said feed material, those constituents with higher vapor pressure have evaporated faster than those with lower vapor pressure. As a consequence, the resulting film has lacked the chemical uniformity necessary. The present invention assures that the gas formed by vaporizing the feed material contains substantial uniformity throughout, i.e., a distribution of the constituents in the same ratio as they appear in the feed material.

To accomplish the foregoing, the apparatus shown at 101 in the figure can be employed. In the system 101, the low-melting-point feed material labeled 1 is disposed within an ampoule 2 (or first container means) whose only outlet is a capillary tube 3. The ampoule is made of quartz and the capillary tube is merely an elongation of the ampoule. The ampoule 1 is disposed within a U-shaped quartz tube 4 (or second container means) large enough in internal diameter to receive the ampoule at the upper end of one leg 5 thereof. The capillary tube 3 at the end of the ampoule, as shown, is oriented downward so that the feed material 1, when melted in the manner later discussed, will emit from the open end or tip designated 6 of the tube, drop by drop (see the drop labeled 30) or in a continuous stream and will fall into the U-shaped tube 4. The melt emitting from the open end 6 falls into the leg 5 and toward the U-shaped neck of the tube 5; the temperature inside the tube 4 (in the space immediately below the open end of the capillary tube and up to the exit marked 16 of tube 4 where the vapors 32 exit to deposit on a substrate 33 as a film) should be high (200°–300° C above the melting point of the constituent with the higher melting point) to effect substantially instant vaporization of the drops 30 as they leave the capillary tube 3 and enter this high temperature region.

The temperature of the environment within the tube 4 into which the melt falls from the ampoule can be established at some predetermined high level by a resistance coil 7 spirally wound around the U-shaped tube 4 as shown, and powered by a power source 8 through a variable resistance 9 or other control. The actual temperature within the environment can be adjusted by an automatic control 19 by use of a quartz-shielded thermocouple 10. Various temperature control systems are known and are not shown in any detail in the figure. Similarly, the temperature within the ampoule itself can be controlled by a further resistance coil 11 energized by a further source 12 through a variable resistance 13; the temperature within the ampoule 2 can be sensed by a thermocouple 20 which provides signals to the automatic control means 19, as before, to control the temperature inside the ampoule. The thermocouple 20 is physically located in the space between the ampoule 2 and the tube 4 and as close to the melt as possible. In the system shown, a plug 14 at the upper end of the leg 5 prevents any vapor within the tube from passing upward and out that opening of the tube. Thus, the vapor formed from the melt must pass downward in the leg 5 across the neck of the tube 4 and upward past buffers 15 and out the opening 16 in the U-shaped tube. The U-shaped tube 4, as shown, is housed within a further U-shaped tube 40 (both tubes 4 and 40 are made of quartz) and both are housed within a tube 41. The tube 41 which is mostly cutaway in the figure and which may have appropriate viewing ports, is a molybdenum heat shield. The quartz tube 40 encloses completely the molybdenum coils 7 and 11 which are at very high temperature and prevents molybdenum vapor from exitting into the vacuum chamber and depositing on the substrate 33. The molybdenum tube 41 is at much lower temperature and does not emit vapors. (The heat shield 41 is physically much further from the coils than shown in the figure and for that reason its temperature does not increase to high levels.)

Table I gives values used in actual work on alloys of the general formula $(1-X)As_2Se_3 \cdot XSb_2Se_3$, both the feed material and the film having a distribution of constituents in the same ratio; the examples that follow the table are of a more general nature: Example 4 represents a general situation wherein the alloys are very rich in $Sb_2Se_3$. The temperature designated $T_1$ is the temperature within the ampoule 2; the temperature designated $T_2$ is the temperature within the U-shaped tube 4 in the space surrounded by the coil 7. It should be noted that both temperatures $T_1$ and $T_2$ can be controlled much better than $\pm 0.5°$ C.

TABLE I

| MATERIAL | MELTING POINT (° C) | $T_1$ (° C) | $T_2$ (° C) |
|---|---|---|---|
| $X=0$, $As_2Se_3$ | 370±2 | 400±0.5 | 620±0.5 |
| $X=0.2$, 0.8 $As_2Se_3 \cdot 0.2\ Sb_2Se_3$ | 391±5 | 430±0.5 | 661±0.5 |
| $X=0.4$, 0.6 $As_2Se_3 \cdot 0.4\ Sb_2Se_3$ | 461±5 | 506±0.5 | 736±0.5 |
| $X=0.6$, 0.4 $As_2Se_6 \cdot 0.6\ Sb_2Se_3$ | 526±5 | 576±0.5 | 806±0.5 |
| $X=0.8$, 0.2 $As_2Se_3 \cdot 0.8\ Sb_2Se_3$ | 574±5 | 628±0.5 | 858±0.5 |
| $X=1$, $Sb_2Se_3$ | 612±2 | 670±0.5 | 900±0.5 |

| | | $T_1$ | $T_2$ |
|---|---|---|---|
| EXAMPLE 1 | $As_2Te_3$ | 430° C | 660° C |
| EXAMPLE 2 | $As_2Se_3$ | 400° C | 620° C |
| EXAMPLE 3 | $Sb_2Se_3$ | 670° C | 900° C |
| EXAMPLE 4 | $As_2Se_3\text{-}Sb_2Se_3$ | 670° C | 900° C |

The technique herein described can be used generally for any feed material composed of constituents with relatively low melting points (say 1000° C or lower) irrespective of whether there is or is not a difference in the vapor pressure between components. It is, however, particularly useful for feed materials whose components show large differences in their vapor pressures since other techniques do not perform well in that situation.

Some general comments are made in this paragraph. The system 101 includes a bell jar 102 and vacuum chamber plate 103; a vacuum within the vacuum chamber formed by these two elements is maintained by a vacuum pump 18. To assure purity of the feed material, it is sealed within the ampoule 2 under vacuum and maintained in that way. When the ampoule 2 is placed in the tube 4 (and only then) the tip 6 of the capillary tube is broken. In an operating system 101 the resistance coil 7 is first energized to establish the temperature $T_2$; then the resistance coil 11 is energized to establish the temperature $T_1$. In order for the vapors 32 to condense upon the substrate 33, the substrate, of course, must be at a temperature lower than the melting point of the lowest-melting-point material in the vapor. The substrate is cooled when forming amorphous films and heated when crystalline films are formed.

Modifications of the invention herein described will occur to persons skilled in the art and all such modifications are deemed to be within the spirit and scope of the invention as defined by the appended claims.

What is claimed is:

1. Apparatus for making films composed of a feed material whose constituents have different vapor pressures upon a substrate appropriately positioned with respect to the apparatus, that comprises: an ampoule whose only outlet is a capillary tube oriented downward, means for creating a temperature within the ampoule sufficient to melt said constituents which emit from the downwardly oriented capillary tube, means to control the level of said temperature, means for creating a controlled high-temperature environment into which the constituents emit that is well above the melting point of the constituent of the feed material having the highest melting point, and means to determine when the temperature of the environment is at some predetermined level and to provide a signal that is connected to said means to control, thereby to effect heating of the ampoule to create a melt therein, the molten constituents being emitted from the end of the capillary tube and being quickly vaporized within the heated environment.

2. Apparatus as claimed in claim 1 in which the means for creating a controlled high-temperature environment comprises a U-shaped tube large enough in internal diameter to receive the ampoule at the upper end of one leg thereof, the capillary tube at the end of the ampoule being oriented downward so that the melt falls into the leg of the tube toward the curved neck thereof and is quickly vaporized.

3. Apparatus as claimed in claim 2 in which the U-shaped tube is a quartz tube and in which the means for creating a controlled high-temperature environment comprises an electric heating coil spiraled around the U-shaped tube, electrical power source means connected to energize the coil, and thermocouple means positioned to monitor the temperature of the environment and provide signals for controlling the electric power source means.

4. Apparatus as claimed in claim 3 in which the U-shaped tube is closed at the end of the U that houses the ampoule thereby to prevent the vaporized constituents from passing out said end and is open at the other end thereof, the vaporized constituents passing from said other end for deposition upon a substrate located there.

5. Apparatus as claimed in claim 1 in which the ampoule is a quartz ampoule one end of which is drawn in the form of a capillary tube open at its free end and in which said means for creating a temperature within the ampoule includes an electric heating coil spiraled around the ampoule, electric power source means connected to energize the coil and thermocouple means positioned to monitor the temperature within the ampoule and to provide signals for controlling the electric power source means.

6. Apparatus for growing films, that comprises, first container means in the form of an ampoule to receive a feed material, means raising the temperature of the feed material to a temperature $T_1$ at which all constituents thereof are in the molten state, said first container means acting to maintain the pressure therein at a level at which the constituents are maintained in the molten state and having as a sole outlet therefrom a downwardly oriented capillary tube to provide slow controlled emission of the melt from the first container means, second container means to receive the slowly emitted melt, means maintaining a temperature $T_2$ in the second container means at a level that is higher than $T_1$ and sufficiently high so that all the constituents that emit from the capillary of the first container means are quickly vaporized at the pressure present in the second container means, the second container means having an outlet through which the vapor can leave, and a substrate positioned to receive said vapors which deposit thereupon.

* * * * *